United States Patent
Yang

(10) Patent No.: US 8,487,678 B2
(45) Date of Patent: Jul. 16, 2013

(54) HALF CYCLE DELAY LOCKED LOOP

(75) Inventor: Bo Yang, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 285 days.

(21) Appl. No.: 13/008,657

(22) Filed: Jan. 18, 2011

(65) Prior Publication Data

US 2012/0182053 A1 Jul. 19, 2012

(51) Int. Cl.
*H03L 7/06* (2006.01)
(52) U.S. Cl.
USPC .......................... 327/158; 327/149
(58) Field of Classification Search
None
See application file for complete search history.

(56) References Cited

U.S. PATENT DOCUMENTS

| | | | | |
|---|---|---|---|---|
| 5,463,337 A | * | 10/1995 | Leonowich | 327/158 |
| 6,125,157 A | * | 9/2000 | Donnelly et al. | 375/371 |
| 6,911,853 B2 | * | 6/2005 | Kizer et al. | 327/158 |
| 8,081,020 B2 | * | 12/2011 | Lin | 327/152 |
| 2010/0157701 A1 | * | 6/2010 | Liu | 365/194 |

FOREIGN PATENT DOCUMENTS

| | | |
|---|---|---|
| EP | 0655840 A2 | 5/1995 |
| EP | 0800276 A1 | 10/1997 |
| WO | WO2007109225 A2 | 9/2007 |

OTHER PUBLICATIONS

International Search Report and Written Opinion—PCT/US2012/021767—ISA/EPO—Apr. 5, 2012.

* cited by examiner

*Primary Examiner* — Cassandra Cox
(74) *Attorney, Agent, or Firm* — Kenyon S. Jenckes

(57) ABSTRACT

An integrated circuit for a half cycle delay locked loop is disclosed. The integrated circuit includes an input node coupled to an oscillator having a clock cycle of M. The integrated circuit also includes N delay elements outputting N different phase-shifted signals, where a total delay introduced by the N delay elements is M/2. The integrated circuit also includes a plurality of inverters, each coupled to an output of one of the N delay elements, where the plurality is less than N. The integrated circuit also includes a phase detector coupled to the input node and an inverted Nth phase-shifted signal. The integrated circuit also includes a charge pump coupled to the phase detector and the delay elements.

31 Claims, 12 Drawing Sheets

HALF CYCLE DELAY LOCKED LOOP

TECHNICAL FIELD

The present disclosure relates generally to communication systems. More specifically, the present disclosure relates to a half cycle delay locked loop (DLL).

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals with for different purposes.

However, like other portable electronic devices, mobile devices may have limited battery life. Along with other types of circuits, oscillators consume current during operation, thus shortening battery life. Furthermore, it may be desirable to minimize the amount of noise in reference signals. Therefore, benefits may be realized by a half cycle delay locked loop (DLL).

SUMMARY OF THE INVENTION

An integrated circuit for a half cycle delay locked loop is disclosed. The integrated circuit includes an input node coupled to an oscillator having a clock cycle of M. The integrated circuit also includes N delay elements outputting N different phase-shifted signals, where a total delay introduced by the N delay elements is M/2. The integrated circuit also includes a plurality of inverters, each coupled to an output of one of the N delay elements, where the plurality is less than N. The integrated circuit also includes a phase detector coupled to the input node and an inverted Nth phase-shifted signal. The integrated circuit also includes a charge pump coupled to the phase detector and the delay elements.

In one configuration, combining circuitry is coupled to the phase-shifted signals. The combining circuitry may include exclusive or (XOR) elements, negated AND (NAND) elements and AND elements. The inverters may be configured to invert a portion of the N phase-shifted signals, including the Nth phase-shifted signal, to produce inverted phase-shifted signals. The phase detector may be configured to determine a phase difference. The combining circuitry may be configured to combine less than N of the phase-shifted signals and the inverted phase-shifted signals to produce a frequency multiplied signal with a frequency higher than the oscillator. The integrated circuit may include less than N read buffers. The charge pump may be configured to determine a control signal for the N delay elements based on the phase difference from the phase detector.

A half cycle delay locked loop circuit is also disclosed. The half cycle delay locked loop circuit includes an input node coupled to an oscillator having a clock cycle of M. The half cycle delay locked loop circuit also includes N delay elements outputting N different phase-shifted signals, wherein a total delay introduced by the N delay elements is M/2. The half cycle delay locked loop circuit also includes a plurality of inverters, wherein each inverter is coupled to an output of one of the N delay elements, and wherein the plurality is less than N. The half cycle delay locked loop circuit also includes a phase detector coupled to the input node and an inverted Nth phase-shifted signal. The half cycle delay locked loop circuit also includes a charge pump coupled to the phase detector and the delay elements.

A half cycle delay locked loop is also disclosed. The half cycle delay locked loop includes means for receiving an oscillator input signal having a clock cycle of M. The half cycle delay locked loop also includes means for delaying that output N different phase-shifted signals, wherein a total delay introduced by the means for delaying is M/2. The half cycle delay locked loop also includes means for inverting, wherein each means for inverting is coupled to an output of one of the N means for delaying. The half cycle delay locked loop also includes means for detecting a phase difference. The half cycle delay locked loop also includes means for determining a control signal.

A method for frequency multiplication is also disclosed. An oscillator signal with a clock period of M is received. The oscillator signal is delayed with N delay elements to produce N phase-shifted signals where a total delay introduced by the N delay elements is M/2. Less than N phase-shifted signals are inverted, including the Nth phase-shifted signal, to produce inverted phase-shifted signals. A phase difference between the oscillator signal and an Nth inverted phase-shifted signal is detected. A control signal for the delay elements is determined based on the phase difference.

DETAILED DESCRIPTION

Figure 1:
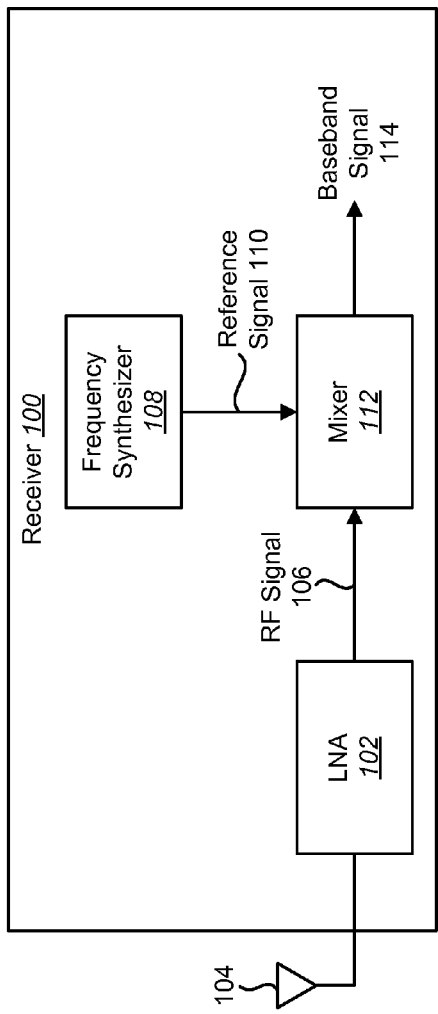
FIG. 1 is a block diagram illustrating a receiver.

FIG. 1 is a block diagram illustrating a receiver 100. The receiver 100 may be part of a mobile device or base station designed for wireless communication. The receiver 100 may include, among other things, a low noise amplifier (LNA) 102, a frequency synthesizer 108 and a mixer 112. The LNA 102 may receive a wireless communication signal from an antenna 104. The LNA 102 may amplify the received signal to usable levels and produce a radio frequency (RF) signal 106, i.e., a representation of the original signal sent. The frequency synthesizer 108 may output a reference signal 110 with a frequency directed to a particular application. The frequency synthesizer 108 may be capable of producing different frequencies, e.g., using a crystal oscillator and multiple frequency multipliers. Although illustrated in the receiver 100, the frequency synthesizer 108 may be used in various applications in a mobile device or base station designed for wireless communication. The mixer 112 may receive the RF signal 106 from the LNA 102 and the reference signal 110 from the frequency synthesizer 108 and produce a baseband signal 114. The baseband signal 114 may be the actual reconstructed audio received by a microphone on a transmitting device, e.g., voiced speech or other kinds of data. Thus, the receiver 100 may use the mixer 112 to reconstruct the baseband signal 114.

Figure 2:
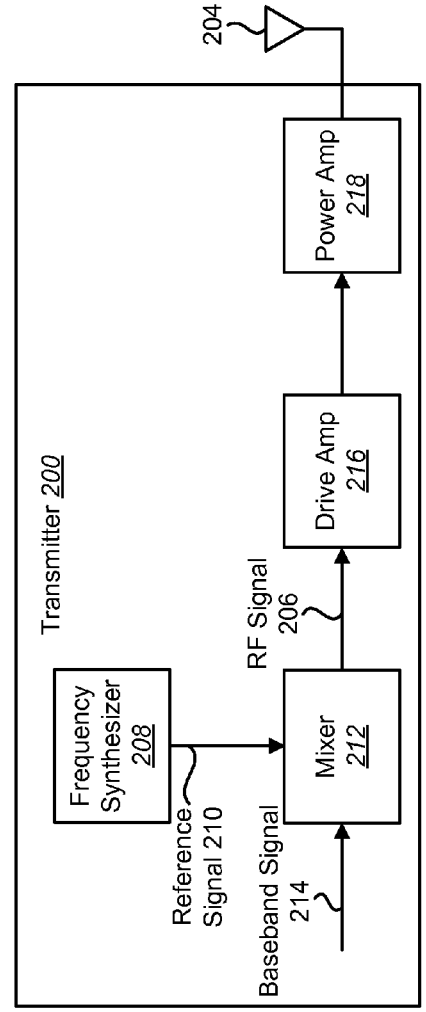
FIG. 2 is a block diagram illustrating a transmitter.

FIG. 2 is a block diagram illustrating a transmitter 200. The transmitter 200 may be part of a mobile device or base station that may also include the receiver 100 illustrated in FIG. 1. The transmitter 200 may include, among other things, a frequency synthesizer 208, a mixer 212, a drive amplifier 216 and a power amplifier 218. The mixer 212 may receive a reference signal 210 and a baseband signal 214 (e.g., voiced speech), and produce an RF signal 206. In other words, the transmitter 200 may use the mixer 212 to produce a modulated, high frequency RF signal 206 to be transmitted. Before the RF signal 206 is transmitted via an antenna 204, it may be amplified by a drive amplifier 216, a power amplifier 218 or both. Thus, the transmitter 200 may use the mixer 212 to construct an RF signal 206 for transmission.

Figure 3:
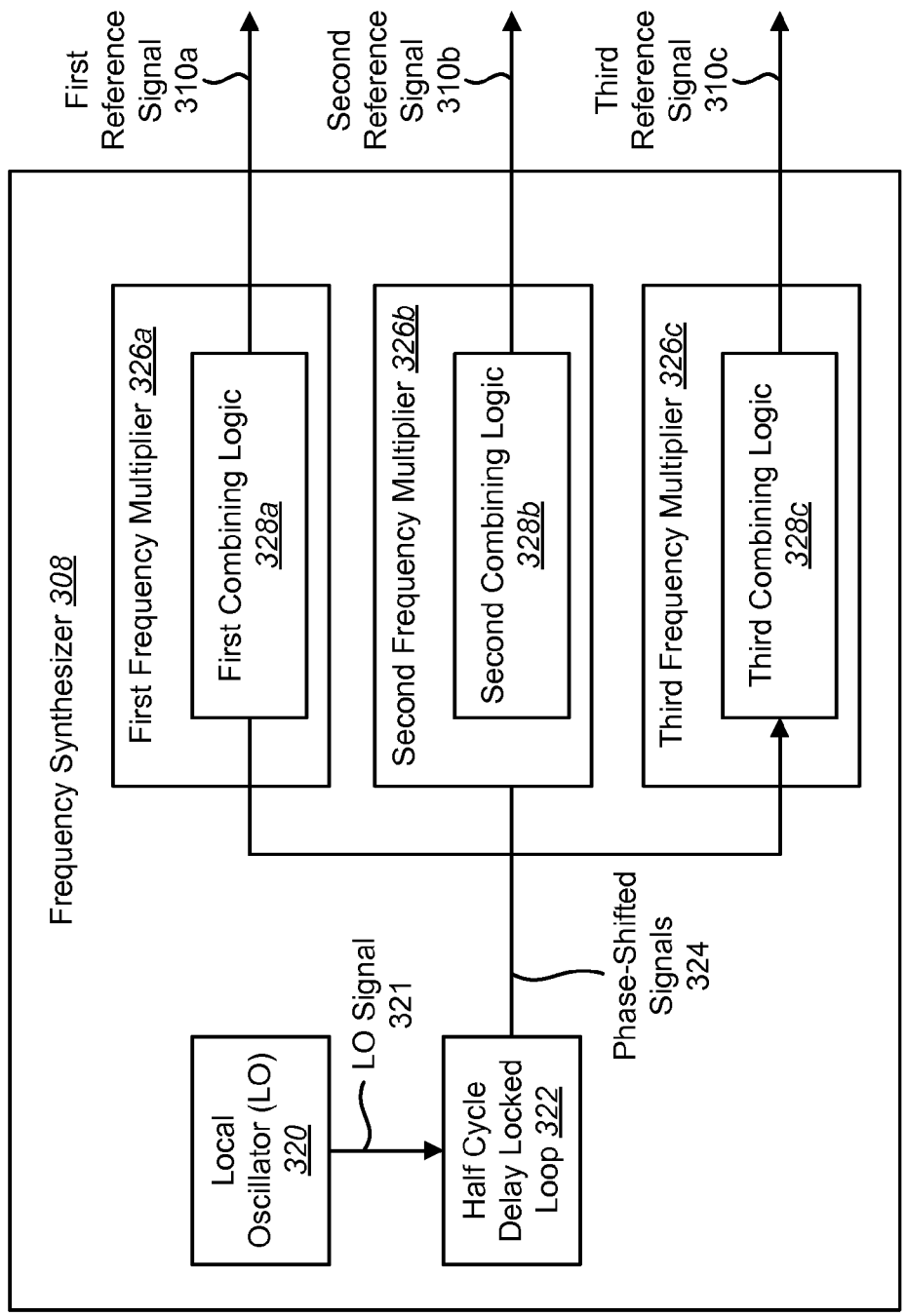
FIG. 3 is a block diagram illustrating a frequency synthesizer.

FIG. 3 is a block diagram illustrating a frequency synthesizer 308. The frequency synthesizer 308 may include a local oscillator (LO) 320 (e.g., a crystal oscillator) that provides a fixed frequency LO signal 321 to a half cycle delay locked loop (DLL) 322. The half cycle DLL 322 may include circuitry in a feedback configuration that delays the LO signal 321 to produce various phase-shifted signals 324.

In one configuration, the LO signal 321 has a period, or cycle, of M. One possible way to implement a delay locked loop is to have X delay elements, where each delay element delays the LO signal 321 by M/X. Thus, the total delay of all X delay elements is M, i.e., one clock cycle. This is referred to as a full cycle DLL.

On the other hand, a half cycle DLL 322 may include N delay elements, where each delay element delays the LO signal 321 by M/2N. Therefore, the total delay of all N elements may be M/2, e.g., half of one clock cycle. A half cycle DLL 322, therefore, has half the number of delay stages and consumes less power than a full cycle DLL because the delay elements consume a large portion of the power consumed in a DLL. Similarly, a half cycle DLL 322 may have roughly half the phase noise contribution from delay stages compared to a full cycle DLL because there are half the number of delay elements in a half cycle DLL 322.

The phase-shifted signals 324 may be fed to one or more frequency multipliers 326a-c in the frequency synthesizer 308. Combining logic 328a-c in each frequency multiplier 326a-c may then combine the phase shifted signals 324 in a way that produces reference signals 310a-c with higher frequencies than the LO signal 321. Different combining logic 328a-c may then allow for reference signals 310a-c to be produced. For example, if the LO signal 321 is 20 MHz, the first reference signal 310a may be 40 MHz using the first combining logic 328a, the second reference signal 310b may be 60 MHz using the second combining logic 328b and the third reference signal 310c may be 80 MHz using the third combining logic 328c.

Figure 4:
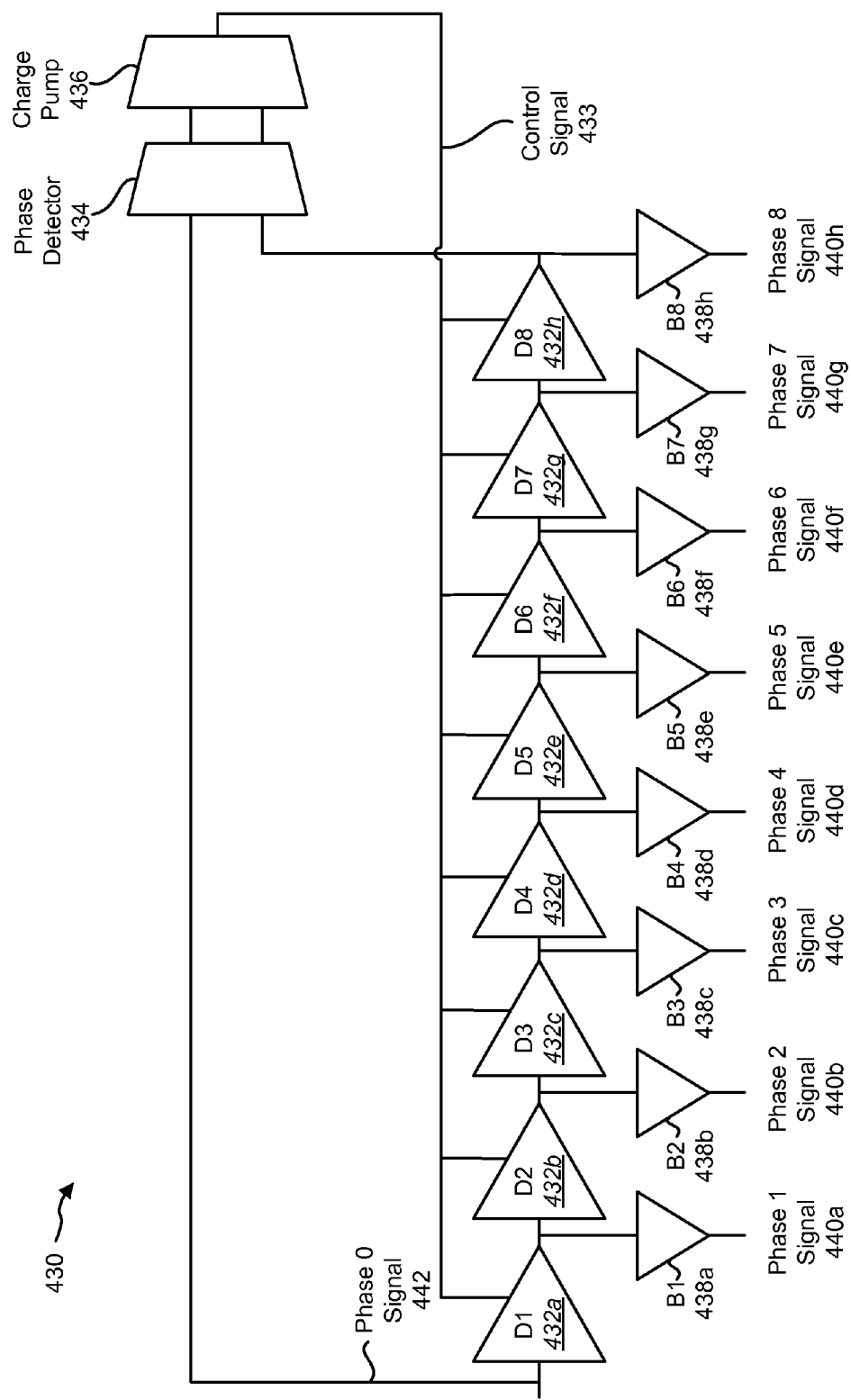
FIG. 4 is a block diagram illustrating a full cycle delay locked loop (DLL)

FIG. 4 is a block diagram illustrating a full cycle delay locked loop (DLL) 430. The full cycle DLL 430 may include multiple delay elements (D1-D8) 432a-h, multiple read buffers (B1-B8) 438a-h, a phase detector 434 and a charge pump 436.

While eight delay elements 432a-h and eight read buffers 438a-h are illustrated, a full cycle DLL 430 may include more or less than eight delay elements 432a-h and eight read buffers 438a-h. The term "full cycle" refers to a DLL with delay elements 432a-h that have a combined delay of one full clock cycle. For example, each of the delay elements 432a-h may have a delay of ⅛ of a clock cycle in the illustrated full cycle DLL 430. Therefore, the total combined delay for all eight delay elements 432a-h may be one full clock cycle, i.e., the phase 8 signal 440h may have the same phase as the phase 0 signal 442.

In the full cycle DLL 430, a first delay element (D1) 432a may delay the phase of an input signal, the phase 0 signal 442, and a first read buffer (B1) 438a may be used to read out the phase-shifted signal, i.e., the phase 1 signal 440a. Likewise, a second delay element (D2) 432b may delay the phase of an input signal, the phase 1 signal 440a equivalent, and a second read buffer (B2) 438b may be used to read out the phase-shifted signal, i.e., the phase 2 signal 440b. A similar delay may be introduced by the third through eighth delay elements (D3-D8) 432c-h and the respective phase-shifted signals (phase 3-8 signals 440c-h) may be read out using read out buffers (B3-B8) 438c-h. The phase-shifted signal produced by the eighth delay element (i.e., a phase 8 signal 440h equivalent) may be fed to a phase detector 434 that compares it with the phase 0 signal 442. The phase detector 434 may determine the difference in phase between the phase 0 signal 442 and the phase 8 signal 440h equivalent and send the phase difference to the charge pump 436. The charge pump 436 may determine a control signal 433 that is fed back to the delay elements (D1-D8) 432a-h.

Figure 5:
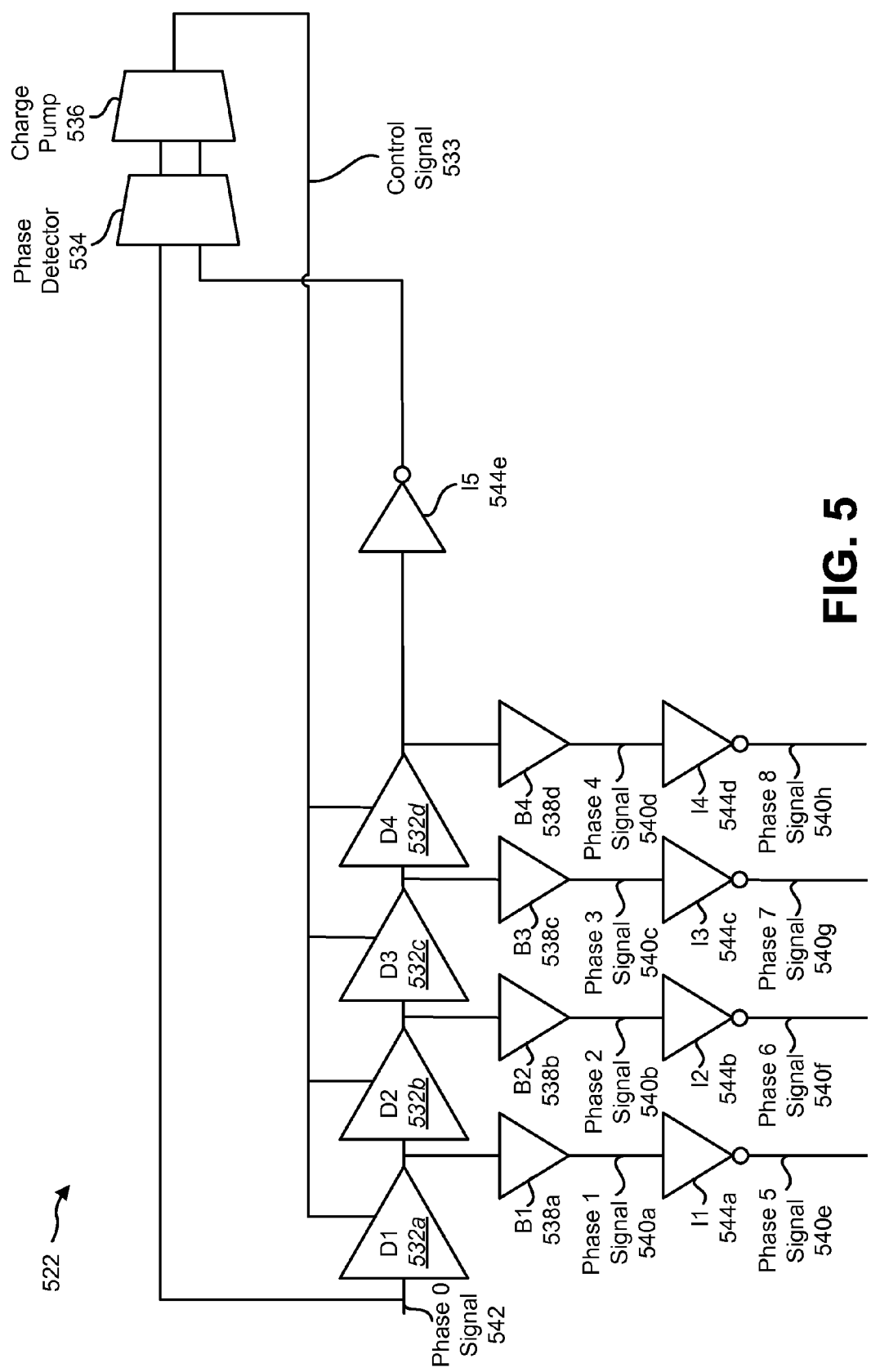
FIG. 5 is a block diagram illustrating a half cycle delay locked loop (DLL)

FIG. 5 is a block diagram illustrating a half cycle delay locked loop (DLL) 522. The half cycle DLL 522 may include multiple delay elements (D1-D4) 532a-d, multiple read buffers (B1-B4) 538a-d, multiple inverters (I145) 544a-e, a phase detector 534 and a charge pump 536.

Delay locked loops (DLL) generally may use integer amounts of delay cycles because it may provide the best symmetry. This, in turn, may require a certain number of delay elements 532a-d. For applications that are not sensitive to phase noise, such as a central processing unit (CPU) clock, a large number of delay elements is acceptable because the power consumption of each stage is low and a digital circuit is not overly sensitive to noise compared to an RF/analog circuit. Therefore, a full cycle DLL 430 may be appropriate for digital applications.

However, RF/analog circuits may be more sensitive to noise and power consumption than digital circuits. One possible RF/analog application for a DLL is a frequency multiplier that generates multiple reference clocks with various frequencies. To minimize phase noise in a reference clock, the DLL delay cell 532a-d size may be large enough to have a low flicker noise, which results in high power consumption. This clocked current consumption on an integrated circuit may also contribute reference spurs in the synthesizer. Therefore, minimizing frequency multiplier current consumption is beneficial to both power consumption and performance.

To this end, a half cycle DLL 522 may be used in noise and power sensitive RF/analog applications, e.g., a frequency multiplier for a reference clock. The four delay elements (D1-D4) 532*a-d* and four read buffers (B1-B4) 538*a-d* in the half cycle DLL 522 may correspond and have similar functionality to the first four delay elements delay elements (D1-D4) 432*a-d* and four read buffers (B1-B4) 438*a-d* in the full cycle DLL 430. However, instead of four additional delay elements (D5-D8) 432*e-h* illustrated in the full cycle DLL 430, the half cycle DLL 522 may include four inverters (I1-I4) 544*a-d* to invert the phase 1 signal 540*a*, phase 2 signal 540*b*, phase 3 signal 540*c* and phase 4 signal 540*d* into the phase 5 signal 540*e*, phase 6 signal 540*f*, phase 7 signal 540*g* and phase 8 signal 540*h*, respectively. Additionally, a fifth inverter (I5) 544*e* may invert the output of the fourth delay element (D4) 532*d* to produce the phase 8 signal 540*h* to feed into the phase detector 534. One or more of the inverters 540*a-e* may be fast inverters, e.g., for edge combining The phase detector 534 may determine the difference in phase between the phase 0 signal 542 and the phase 8 signal 540*h* equivalent and send the phase difference to the charge pump 536. The charge pump 536 may determine a control signal 533 that is fed back to the delay elements (D1-D4) 532*a-d*. The control signal 533 may be a voltage signal that tunes the delay time of the delay elements (D1-D4) 532*a-d*. It may also supply feedback to reject certain phase noises in the loop 522.

While four delay elements (D1-D4) 532*a-d*, four read buffers (B1-B4) 538*a-d* and five inverters (I1-I5) 544*a-e* are illustrated, a half cycle DLL 522 may include more or less than four delay elements (D1-D4) 532*a-d*, four read buffers (B1-B4) 538*a-d* and five inverters (I1-I5) 544*a-e*. The term "half cycle" refers to a DLL with delay elements 532*a-d* that have a combined delay of one half of a clock cycle. For example, each of the delay elements 532*a-d* may have a delay of ⅛ of a clock cycle. Therefore, the total combined delay for all four delay elements 532*a-d* may be one half (i.e., 4/8) of a clock cycle.

Therefore, a half cycle DLL 522 used in an RF/analog application (e.g., for frequency multiplication) may result in improved noise and reduced current consumption compared to a full cycle DLL 430. This may reduce reference spurs. In other words, since the delay elements consume relatively large amounts of current and introduce a relatively large portion of noise, the reduction in the amount of delay elements (D1-D4) 532*a-d* in the half cycle DLL 522 may result in performance gains even though more inverters (I1-I5) 544*a-e* may be used. One reason for this is that a half-cycle DLL 522 may not have a read buffer 538*a-d* and an inverter 544*a-e* for each delay element 532*a-d*. Rather, read buffer 538*a-d* and inverters 544*a-e* may only be present for signals that are used in combining circuitry, as discussed below.

Figure 6:
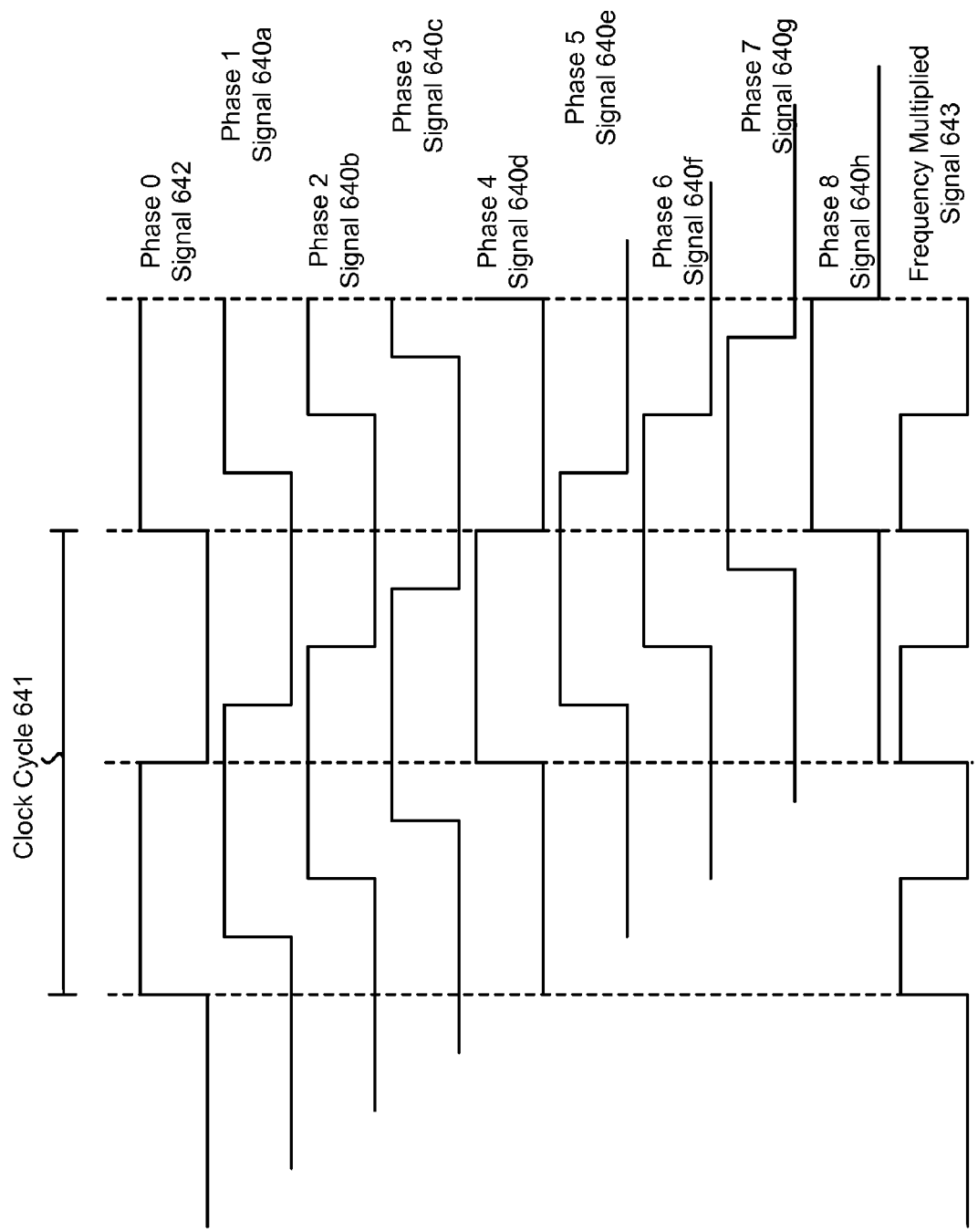
FIG. 6 is a timing diagram illustrating the phase signals produced by a delay locked loop (DLL)

FIG. 6 is a timing diagram illustrating the phase signals 640*a-h*, 642 produced by a delay locked loop (DLL). With reference to the half cycle DLL 522 illustrated in FIG. 5, the phase 0 signal 642 may be received at an input node, delayed by a first delay element 532*a* and read out to produce the phase 1 signal 640*a*. Therefore, the leading edge of the phase 1 signal 640*a* is shifted by ⅛ of the clock cycle 641, i.e., all four of the delay elements 532*a-d* in the half cycle DLL 522 combine to shift the phase 0 signal 642 only ½ of the clock cycle 641. The phase 5 signal 640*e* may be produced by inverting the phase 1 signal 640*a*. Similarly, the phase 1 signal 640*a* may be delayed by a second delay element 532*b* and read out to produce the phase 2 signal 640*b*. The phase 6 signal 640*f* may be produced by inverting the phase 2 signal 640*b*. Similarly, the phase 2 signal 640*b* may be delayed by a third delay element 532*c* and read out to produce the phase 3 signal 640*c*. The phase 7 signal 640*g* may be produced by inverting the phase 3 signal 640*c*. Similarly, the phase 4 signal 640*d* may be delayed by a fourth delay element 532*d* and read out to produce the phase 4 signal 640*d*. The phase 8 signal 640*h* may be produced by inverting the phase 4 signal 640*d*.

Therefore, the half cycle DLL 522 may be able to produce the same amount of phase shifted signals based on an input signal as a full cycle DLL 430. However, the half cycle DLL 522 may have better power consumption and noise performance because it only has half as many delay elements 532*a-d* with only a few additional circuit elements (e.g., inverters 544*a-d*).

In one configuration, two or more of the signals 640*a-h*, 642 may be combined for frequency multiplication. For example, the exclusive or (XOR) of the phase 0 signal 642 and the phase 2 signal 640*b* may produce the frequency multiplied signal 643 that has a frequency that is twice as large as the phase 0 signal 642.

Figure 7:
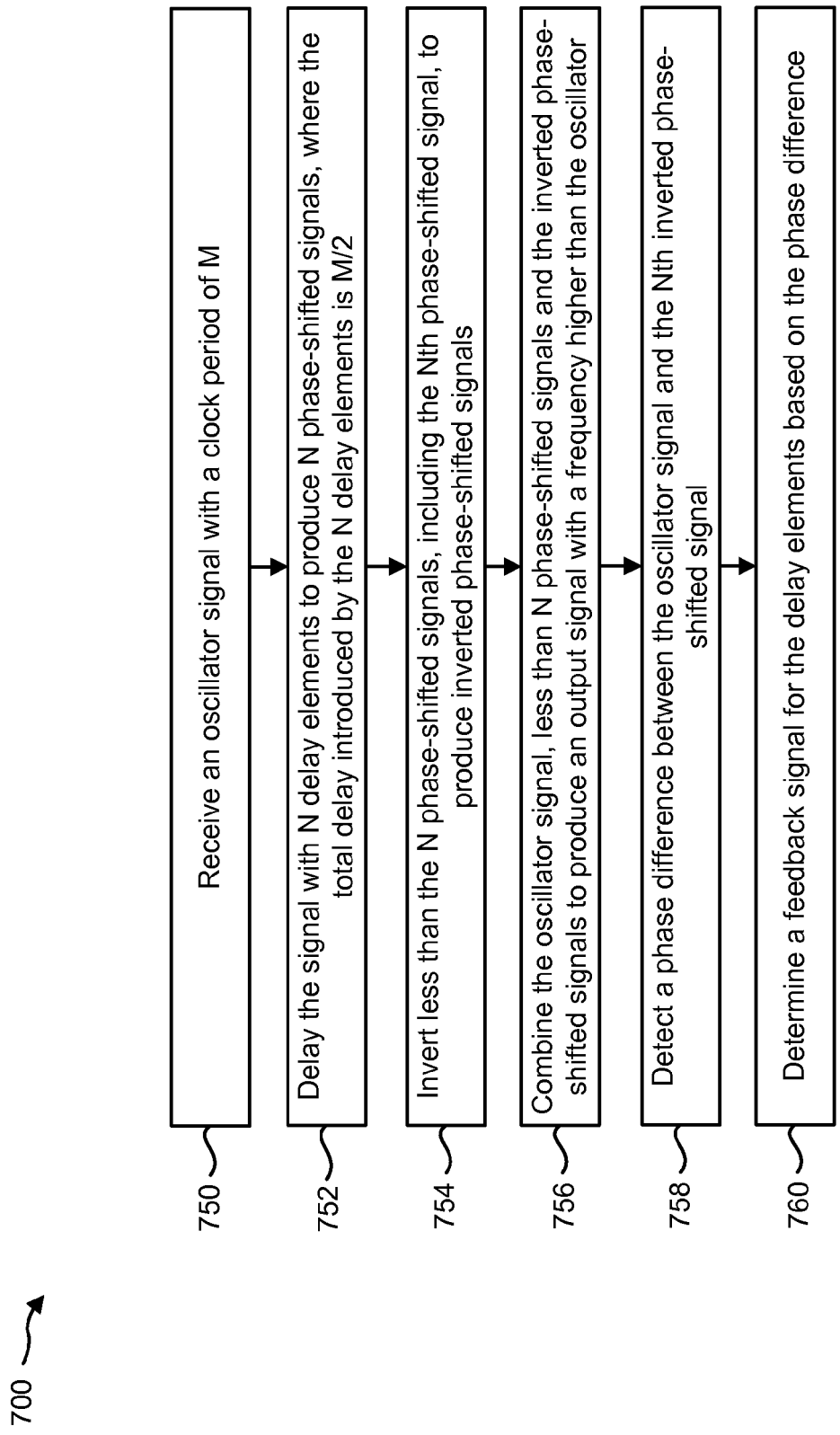
FIG. 7 is a flow diagram illustrating a method for frequency multiplication.

FIG. 7 is a flow diagram illustrating a method 700 for frequency multiplication. The method 700 may be performed by a half cycle DLL 522. The half cycle DLL 522 may receive 750 an oscillator signal with a clock period 641 of M. For example, the oscillator signal may be from a crystal oscillator. The half cycle DLL 522 may delay 752 the signal with N delay elements 532*a-d* to produce N phase-shifted signals, where the total delay introduced by the N delay elements 532*a-d* is M/2. While four delay elements 532*a-d* are illustrated in FIG. 5, a different amount of delay elements may be used if the total delay introduced by all the delay elements 532*a-d* is half of one clock cycle (M) 641. The half cycle DLL 522 may also invert 754 less than the N phase-shifted signals, including the Nth phase-shifted signal, to produce inverted phase-shifted signals. In one configuration, the phase 1 signal 540*a*, phase 2 signal 540*b*, phase 3 signal 540*c* and phase 4 signal 540*d* may be the phase-shifted signals and the phase 5 signal 540*e*, phase 6 signal 540*f*, phase 7 signal 540*g* and phase 8 signal 540*h* may be the inverted phase-shifted signals. The half cycle DLL 522 may also combine 756 the oscillator signal (e.g., the phase 0 signal 542), less than N phase-shifted signals and the inverted phase-shifted signals to produce an output signal with a frequency higher than the oscillator. In other words, the output signal may have a clock cycle shorter than the oscillator. For example, combination circuitry may be used to produce a frequency multiplied signal 643. The half cycle DLL 522 may also detect 758 a phase difference between the oscillator signal and the Nth inverted phase-shifted signal, i.e., using a phase detector 534. The half cycle DLL 522 may also determine 760 a feedback signal (e.g., the control signal 533) for the delay elements 532*a-d* based on the phase difference.

Figure 8:
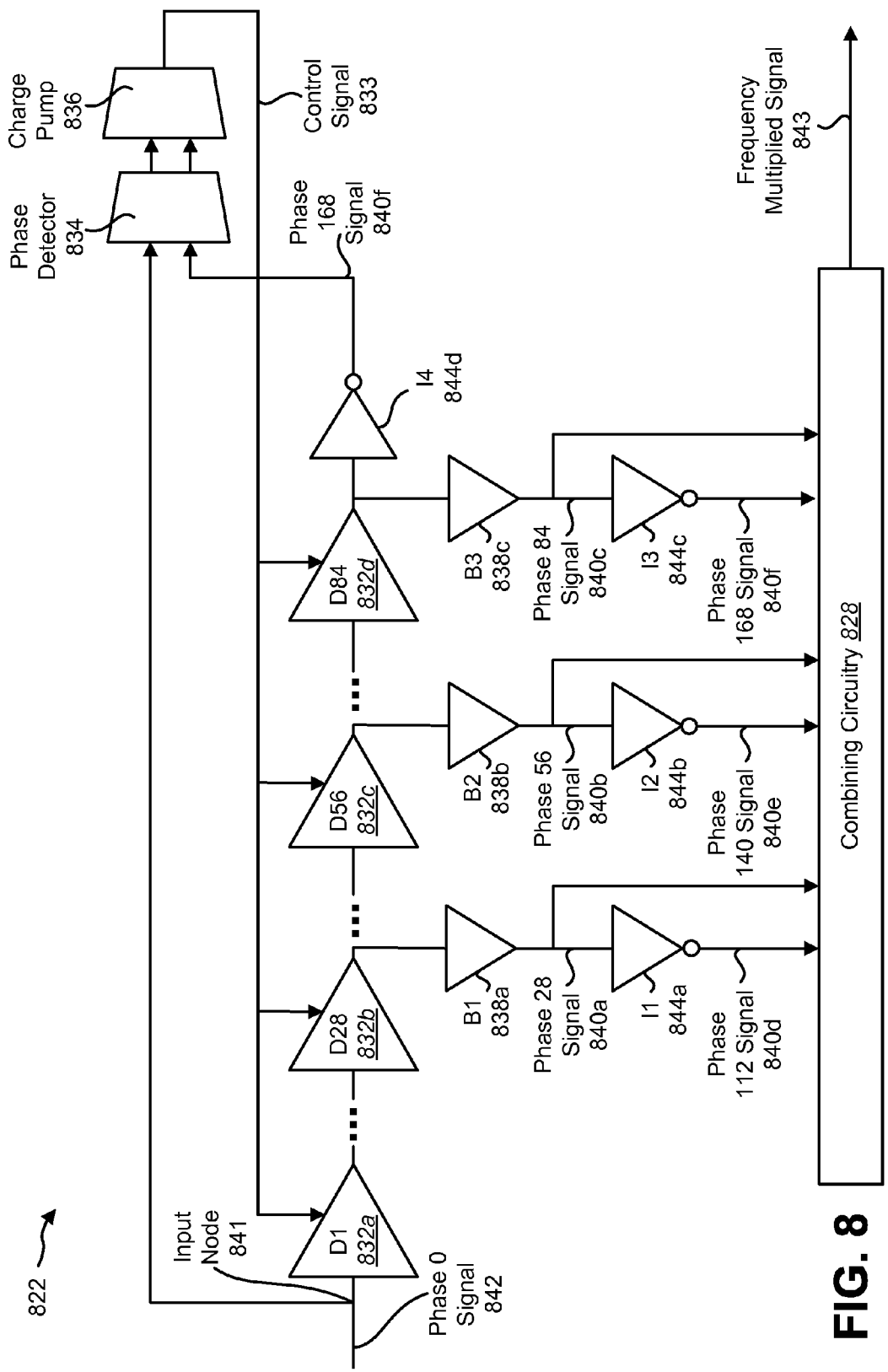
FIG. 8 is a block diagram illustrating another configuration of a half cycle delay locked loop (DLL)

FIG. 8 is a block diagram illustrating another configuration of a half cycle delay locked loop (DLL) 822. The half cycle DLL 822 may include multiple delay elements (D1-D84) 832*a-d*, multiple read buffers (B1-B3) 838*a-c*, multiple inverters (I1-I4) 844*a-d*, a phase detector 834 and a charge pump 836. While only four delay elements (D1, D28, D56, D84) 832*a-d* are illustrated, 84 are present in the half cycle DLL 822, each delaying its respective input by 1/168 of a clock cycle. However, only three read buffers (B1-B3) 838*a-c* and four inverters (I1-I4) 844*a-d* may be included in the half-cycle DLL 822, i.e., read buffers (B1-B3) 838*a-c* and inverters (I1-I4) 844*a-d* may not be used for each delay element, only those illustrated. A full cycle DLL with equivalent functionality may use 168 delay elements, however, the half cycle DLL 822 may use only 84 delay elements (D1-D84) 832*a-d*, thus resulting in less noise and power consumption.

The 84 delay elements (D1-D84) 832a-d and three read buffers (B1-B4) 838a-c in the half cycle DLL 822 may correspond and have similar functionality to the four delay elements delay elements (D1-D4) 532a-d and read buffers (B1-B4) 538a-d in the half cycle DLL 522 illustrated in FIG. 5. However, the delay introduced by each delay element (D1-D84) 832a-d may be 1/168 of a clock cycle instead of 1/8 of a clock cycle in FIG. 5, i.e., the total delay of all delay elements 832a-d may be 1/2 (84/168) of a clock cycle. Therefore, after the half cycle DLL 822 receives the phase 0 signal 842 at a receiving/input node, the first delay element (D1) 832a may produce a phase 1 signal (not shown) that is 1/168 out of phase with the phase 0 signal 842. A similar delay is then introduced by each remaining delay element (D2-D84) 832b-d.

Furthermore, the half cycle DLL 822 in FIG. 8, when used with combining circuitry 828 may have more options for frequency multiplication, e.g., in a wireless communication device or in a base station. While many different phases may be produced by the 84 different delay elements 832a-d, only a few phase signals 840a-f may be used by the combining circuitry 828. Specifically, a phase 28 signal 840a, a phase 56 signal 840b, a phase 84 signal 840c, a phase 112 signal 840d, a phase 140 signal 840e and a phase 168 signal 840f may be received by the combining circuitry 828. The combining circuitry 828 may then produce a frequency multiplied signal 843 with a frequency that is an integer multiple of the frequency of the phase 0 signal 842.

Similar to the half cycle DLL 522 in FIG. 5, a fourth inverter (I4) 844d may invert the output of the 84th delay element (D84) 832d to produce the phase 168 signal 840f to feed into the phase detector 834. One or more of the inverters (I1-I4) 844a-d may be fast inverters, e.g., for edge combining. The phase detector 834 may determine the difference in phase between the phase 0 signal 842 (received at an input node 841) and the phase 168 signal 840f and send the phase difference to the charge pump 836. The charge pump 836 may determine a control signal 833 that is fed back to the delay elements (D1-D84) 832a-d.

Figure 9:
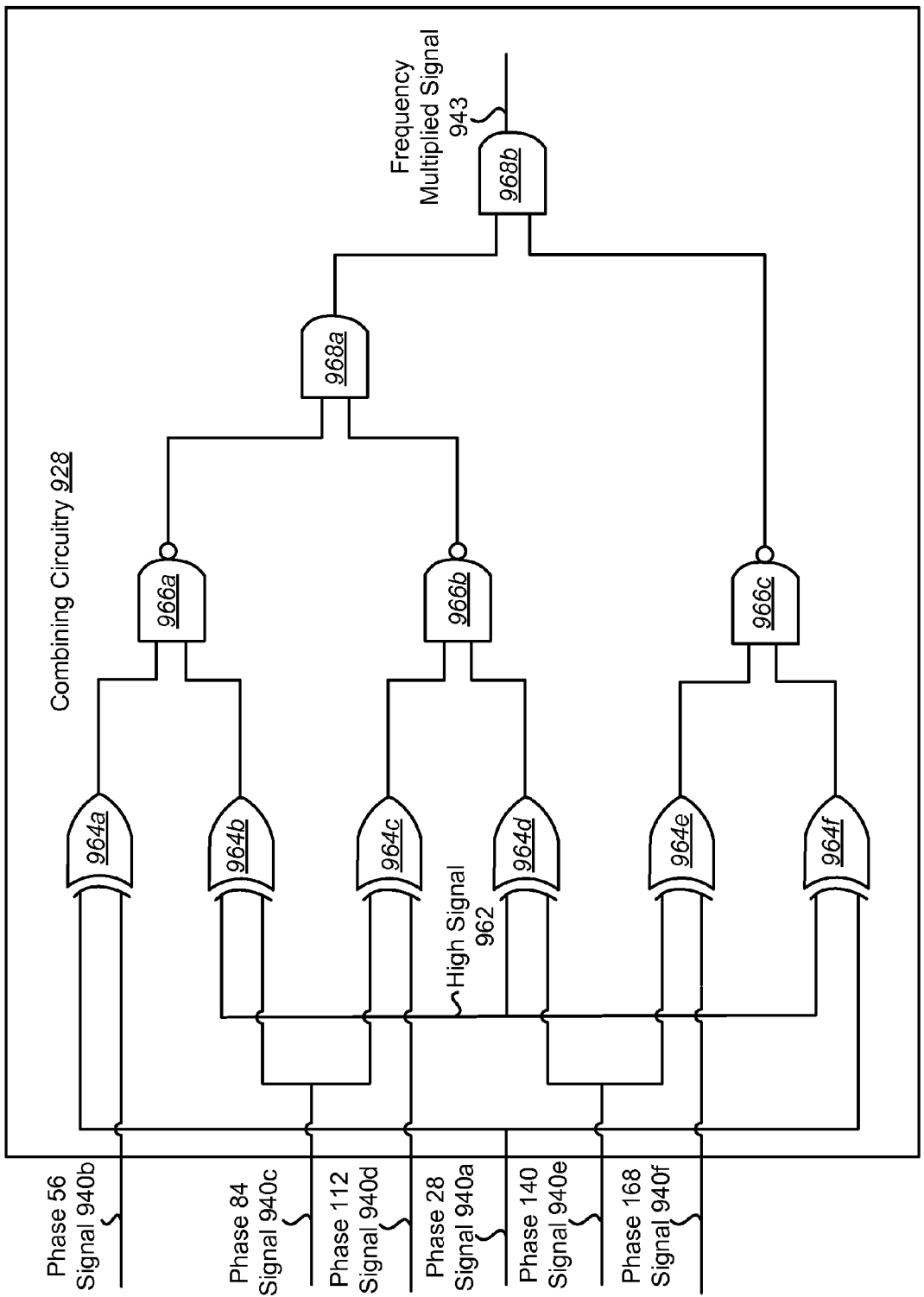
FIG. 9 is a circuit diagram illustrating one configuration of combining circuitry.

FIG. 9 is a circuit diagram illustrating one configuration of combining circuitry 928. Specifically, the combining circuitry 928 may correspond to the combining circuitry 828 for the half cycle DLL 822 illustrated in FIG. 8. The combining circuitry 928 may be used to frequency multiply, i.e., to produce a frequency multiplied signal 943. The combining circuitry 928 may include six XOR elements 964a-f, three NAND elements 966a-c and two AND elements 968a-b.

The first XOR element 964a may receive a phase 28 signal 940a and a phase 56 signal 940b. The second XOR element 964b may receive a high signal 962 and a phase 84 signal 940c. The third XOR element 964c may receive the phase 84 signal 940c and a phase 112 signal 940d. The fourth XOR element 964d may receive the high signal 962 and a phase 140 signal 940e. The fifth XOR element 964e may receive the phase 140 signal 940e and a phase 168 signal 940f. The sixth XOR element 964f may receive the high signal 962 and the phase 28 signal 940a.

A first NAND element 966a may receive the outputs of the first XOR element 964a and the second XOR element 964b as inputs. A second NAND element 966b may receive the outputs of the third XOR element 964c and the fourth XOR element 964d as inputs. A third NAND element 966c may receive the outputs of the fifth XOR element 964e and the sixth XOR element 964f as inputs. A first AND element 968a may receive the output of the first NAND element 966a and the second NAND element 966b. A second AND element 968b may receive the output of the first AND element 968a and the third NAND element 966c to produce the frequency multiplied signal 943. Therefore, the combining circuitry 928 may produce a multiplied clock, e.g., 3× or 4×.

Figure 10:
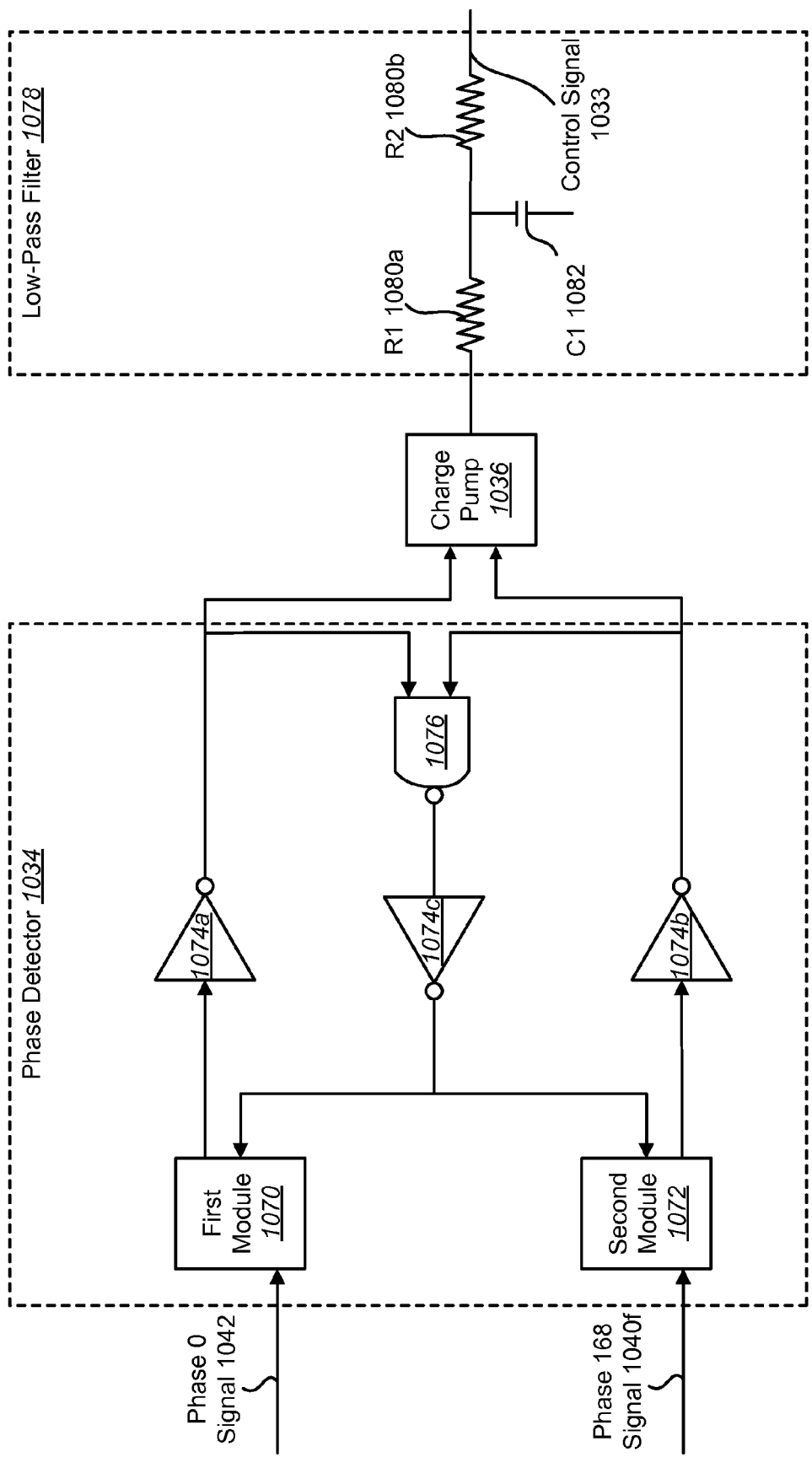
FIG. 10 is a block diagram illustrating a phase detector, a charge pump and a low-pass filter.

FIG. 10 is a block diagram illustrating a phase detector 1034, a charge pump 1036 and a low-pass filter 1078. Specifically, the phase detector 1034 and charge pump 1036 may correspond to the phase detector 834 and charge pump 836 for the half cycle DLL 822 illustrated in FIG. 8. The phase detector 1034 may determine a phase difference between two signals, e.g., a phase 0 signal 1042 and a phase 168 signal 1040f. The phase detector 1034 may include a first module 1070 that receives the phase 0 signal 1042 and a second module 1072 that receives a phase 168 signal 1040f. The first module 1070 and the second module 1072 may be D-flipflops that together function as a phase detector 1034 or phase and frequency detector. The output of the first module 1070 may be inverted by a first inverter 1074a and the output of the second module 1072 may be inverted by a second inverter 1074b. The outputs of the first inverter 1074a and second inverter 1074b may be input into a NAND element 1076. The output of the NAND element 1076 may be inverted by a third inverter 1074c and fed back to the first module 1070 and second module 1072. Therefore, the phase error between the phase 0 signal 1042 and the phase 168 signal 1040f may be converted into a voltage signal, which may control the charge pump 1036.

The charge pump 1036 may be used to determine a control signal 1033 that is fed back to delay elements (D1-D84) 832a-d. The charge pump 1036 may receive the output of the phase detector 1034 (i.e., the output of the first inverter 1074a and the second inverter 1074b) and produces the control signal 1033. In other words, the charge pump 1036 may inject charge into the low-pass filter 1078. The output of the charge pump 1036 (i.e., the injected charge) may be filtered in the low-pass filter 1078 by a combination of resistors (R1-R2) 1080a-b and a capacitor (C1) 1082.

Figure 11:
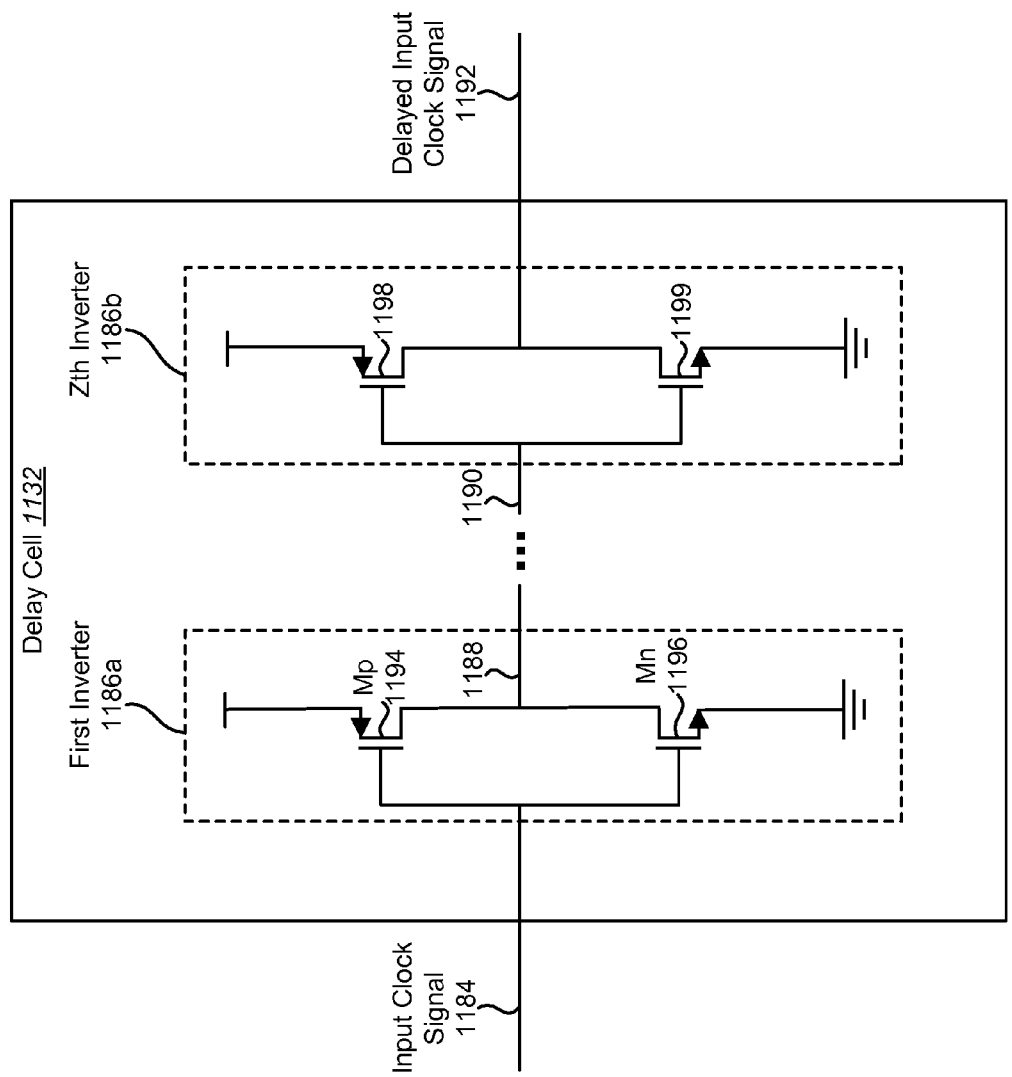
FIG. 11 is a circuit diagram illustrating a delay cell.

FIG. 11 is a circuit diagram illustrating a delay cell 1132. The delay cell 1132 of FIG. 11 may be one configuration of the delay cell 532a-d of FIG. 5 or the delay cell 832a-d of FIG. 8. The delay cell 1132 may introduce a delay to an input clock signal 1184. The delay cell 1132 may include Z inverters 1186a-b, where Z is an even number. For example, Z may equal 2, 4, 6, 8, 10, etc.

The first inverter 1186a may receive the input clock signal 1184. The first inverter 1186a may include a p-type metal oxide semiconductor (PMOS) transistor Mp 1194 and an n-type metal oxide semiconductor (NMOS) transistor Mn 1196. The gate of the PMOS transistor Mp 1194 may be coupled to the input node of the delay cell 1132, i.e., where the input clock signal 1184 is received. The source of the PMOS transistor Mp 1194 may be coupled to a source voltage. The drain of the PMOS transistor Mp 1194 may be coupled to a first node 1188. The first node 1188 may be the output of the first inverter 1186a. The gate of the NMOS transistor Mn 1196 may be coupled to the input node of the delay cell 1132. The source of the NMOS transistor Mn 1196 may be coupled to ground. The drain of the NMOS transistor Mn 1196 may be coupled to the first node 1188.

The output of the first inverter 1186a (i.e., the first node 1188) may be coupled to the input of another inverter. For example, if the delay cell 1132 includes more than two inverters 1186a-b, the first node 1188 may be coupled to an intermediate inverter (not shown). Alternatively, if the delay cell 1132 includes only two inverters 1186a-b, the output of the first inverter 1186a (i.e., the first node 1188) may be coupled to a second node 1190 (i.e., the input of the Zth, or 2nd, inverter 1186b). Regardless of the number of inverters 1186a-b in the delay cell 1132, the Zth inverter 1186b may eventually receive the output of a previous inverter at its input (i.e., the second node 1190). The Zth inverter 1186*b* may include a PMOS transistor 1198 and an NMOS transistor 1199. The gate of the PMOS transistor 1198 may be coupled to the second node 1190. The source of the PMOS transistor 1198 may be coupled to a source voltage. The drain of the PMOS transistor 1198 may be coupled to the output of the Zth inverter 1186*b*. The gate of the NMOS transistor 1199 may be coupled to the second node 1190. The source of the NMOS transistor 1199 may be coupled to ground. The drain of the NMOS transistor 1199 may be coupled to the output of the Zth inverter 1186*b*. The output of the third inverter 1186*b* may be the delayed clock signal 1192. Each inverter stage 1186*a-b* may introduce a time delay at every logic change, as the finite impedance of a transistor and a loading cap (not shown) may generate a resistive-capacitive (RC) delay. As long as this delay time is small enough, it may be ignored. Also the delay could be compensated with a transmission gate (i.e., a parallel combination of an NMOS transistor with a PMOS transistor with the input at the gate of one transistor being complementary to the input at the gate of the other).

Figure 12:
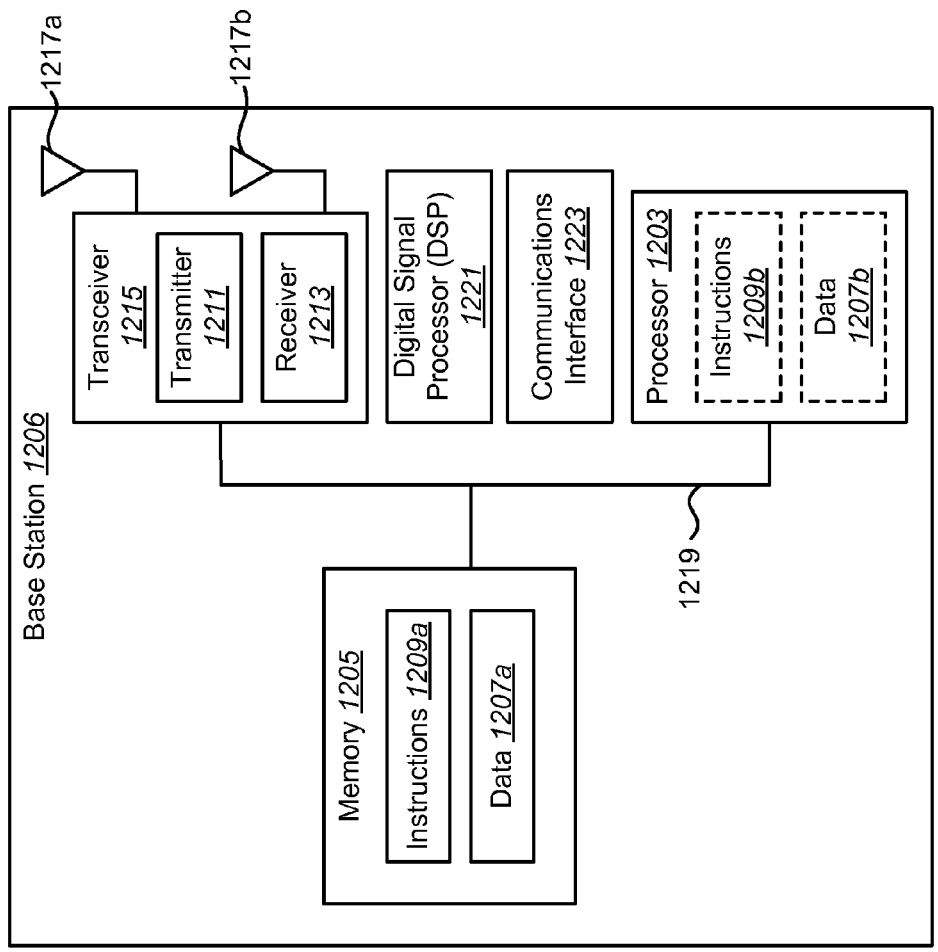
FIG. 12 illustrates certain components that may be included within a base station.

FIG. 12 illustrates certain components that may be included within a base station 1206. A base station 1206 may also be referred to as, and may include some or all of the functionality of, an access point, a broadcast transmitter, a node B, an evolved node B, etc. The base station 1206 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the base station 1206 of FIG. 12, in an alternative configuration, a combination of processors (e.g., an ARM and DSP) could be used.

The base station 1206 also includes memory 1205. The memory 1205 may be any electronic component capable of storing electronic information. The memory 1205 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1207*a* and instructions 1209*a* may be stored in the memory 1205. The instructions 1209*a* may be executable by the processor 1203 to implement the methods disclosed herein. Executing the instructions 1209*a* may involve the use of the data 1207*a* that is stored in the memory 1205. When the processor 1203 executes the instructions 1209*a*, various portions of the instructions 1209*b* may be loaded onto the processor 1203, and various pieces of data 1207*b* may be loaded onto the processor 1203.

The base station 1206 may also include a transmitter 1211 and a receiver 1213 to allow transmission and reception of signals to and from the base station 1206. The transmitter 1211 and receiver 1213 may be collectively referred to as a transceiver 1215. Multiple antennas 1217*a-b* may be electrically coupled to the transceiver 1215. The base station 1206 may also include (not shown) multiple transmitters, multiple receivers, multiple transceivers and/or additional antennas.

The base station 1206 may include a digital signal processor (DSP) 1221. The base station 1206 may also include a communications interface 1223. The communications interface 1223 may allow a user to interact with the base station 1206.

The various components of the base station 1206 may be coupled together by one or more buses, which may include a power bus, a control signal bus, a status signal bus, a data bus, etc. For the sake of clarity, the various buses are illustrated in FIG. 12 as a bus system 1219.

Figure 13:
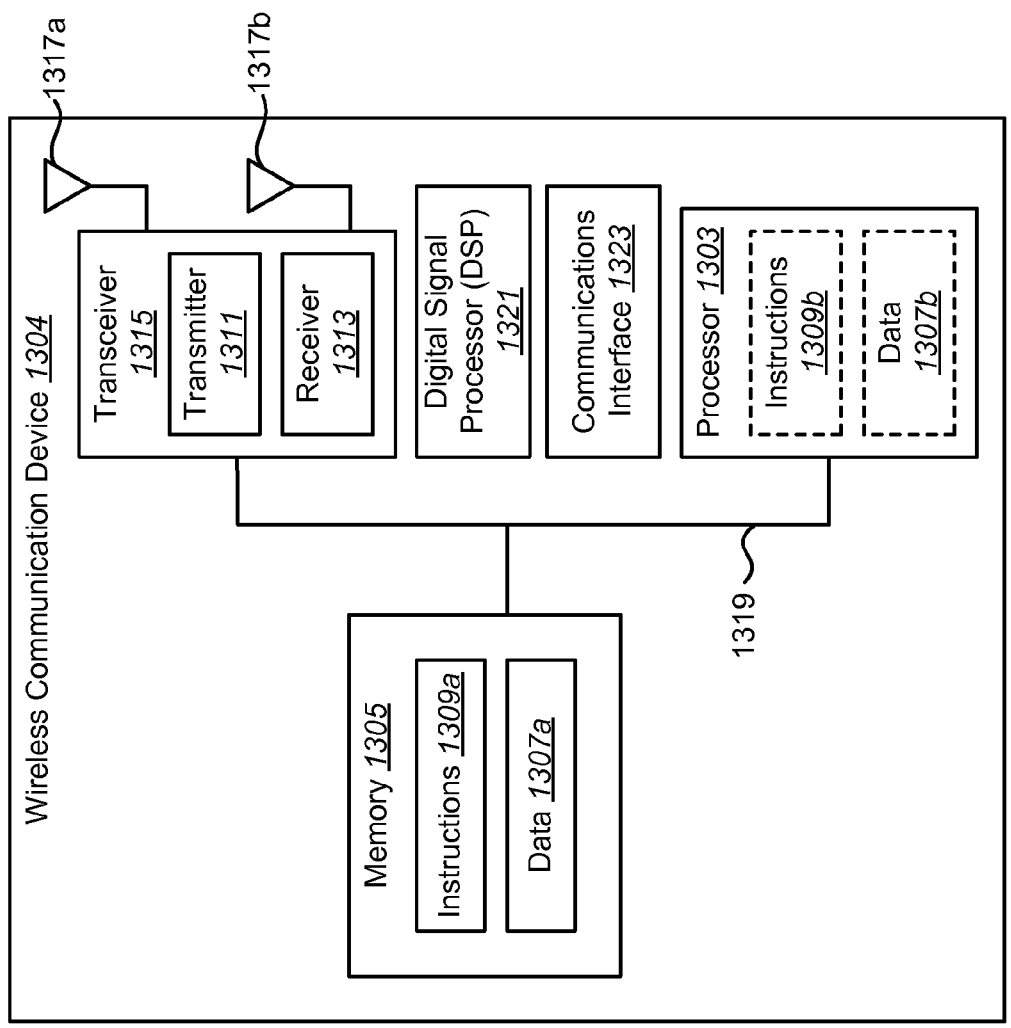
FIG. 13 illustrates certain components that may be included within a wireless communication device.

FIG. 13 illustrates certain components that may be included within a wireless communication device 1304. The wireless communication device 1304 may be an access terminal, a mobile station, a user equipment (UE), etc. The wireless communication device 1304 includes a processor 1303. The processor 1303 may be a general purpose single- or multi-chip microprocessor (e.g., an ARM), a special purpose microprocessor (e.g., a digital signal processor (DSP)), a microcontroller, a programmable gate array, etc. The processor 1303 may be referred to as a central processing unit (CPU). Although just a single processor 1303 is shown in the wireless communication device 1304 of FIG. 13, in an alternative configuration, a combination of processors (e.g., an ARM and DSP) could be used.

The wireless communication device 1304 also includes memory 1305. The memory 1305 may be any electronic component capable of storing electronic information. The memory 1305 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1307*a* and instructions 1309*a* may be stored in the memory 1305. The instructions 1309*a* may be executable by the processor 1303 to implement the methods disclosed herein. Executing the instructions 1309*a* may involve the use of the data 1307*a* that is stored in the memory 1305. When the processor 1303 executes the instructions 1309*a*, various portions of the instructions 1309*b* may be loaded onto the processor 1303, and various pieces of data 1307*b* may be loaded onto the processor 1303.

The wireless communication device 1304 may also include a transmitter 1311 and a receiver 1313 to allow transmission and reception of signals to and from the wireless communication device 1304. The transmitter 1311 and receiver 1313 may be collectively referred to as a transceiver 1315. Multiple antennas 1317*a-b* may be electrically coupled to the transceiver 1315. The wireless communication device 1304 may also include (not shown) multiple transmitters, multiple receivers, multiple transceivers and/or additional antennas.

The wireless communication device 1304 may include a digital signal processor (DSP) 1321. The wireless communication device 1304 may also include a communications interface 1323. The communications interface 1323 may allow a user to interact with the wireless communication device 1304.

The various components of the wireless communication device 1304 may be coupled together by one or more buses, which may include a power bus, a control signal bus, a status signal bus, a data bus, etc. For the sake of clarity, the various buses are illustrated in FIG. 13 as a bus system 1319.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit for a half cycle delay locked loop, the integrated circuit comprising:
   an input node coupled to an oscillator having a clock cycle of M;
   N delay elements outputting N different phase-shifted signals, wherein a total delay introduced by the N delay elements is M/2;
   a plurality of inverters, wherein each inverter is coupled to an output of one of the N delay elements, and wherein the plurality is less than N;
   a phase detector coupled to the input node and an inverted Nth phase-shifted signal; and
   a charge pump coupled to the phase detector and the delay elements.

2. The integrated circuit of claim 1, further comprising combining circuitry coupled to the phase-shifted signals.

3. The integrated circuit of claim 2, wherein the combining circuitry comprises multiple exclusive or (XOR) elements, negated AND (NAND) elements and AND elements.

4. The integrated circuit of claim 2, wherein the inverters are configured to invert a portion of the N phase-shifted signals, including the Nth phase-shifted signal, to produce inverted phase-shifted signals.

5. The integrated circuit of claim 4, wherein the phase detector is configured to determine a phase difference between an oscillator input signal and the Nth inverted phase-shifted signal.

6. The integrated circuit of claim 5, wherein the combining circuitry is configured to combine less than N of the phase-shifted signals and the inverted phase-shifted signals to produce a frequency multiplied signal with a frequency higher than the oscillator.

7. The integrated circuit of claim 1, further comprising less than N read buffers.

8. The integrated circuit of claim 5, wherein the charge pump is configured to determine a control signal for the N delay elements based on the phase difference from the phase detector.

9. A half cycle delay locked loop circuit, comprising:
an input node coupled to an oscillator having a clock cycle of M;
N delay elements outputting N different phase-shifted signals, wherein a total delay introduced by the N delay elements is M/2;
a plurality of inverters, wherein each inverter is coupled to an output of one of the N delay elements, and wherein the plurality is less than N;
a phase detector coupled to the input node and an inverted Nth phase-shifted signal; and
a charge pump coupled to the phase detector and the delay elements.

10. The half cycle delay locked loop circuit of claim 9, further comprising combining circuitry coupled to the phase-shifted signals.

11. The half cycle delay locked loop circuit of claim 10, wherein the combining circuitry comprises multiple exclusive or (XOR) elements, negated AND (NAND) elements and AND elements.

12. The half cycle delay locked loop circuit of claim 10, wherein the inverters are configured to invert a portion of the N phase-shifted signals, including the Nth phase-shifted signal, to produce inverted phase-shifted signals.

13. The half cycle delay locked loop circuit of claim 12, wherein the phase detector is configured to determine a phase difference between an oscillator input signal and the Nth inverted phase-shifted signal.

14. The half cycle delay locked loop circuit of claim 13, wherein the combining circuitry is configured to combine less than N of the phase-shifted signals and the inverted phase-shifted signals to produce a frequency multiplied signal with a frequency higher than the oscillator.

15. The half cycle delay locked loop circuit of claim 9, further comprising less than N read buffers.

16. The half cycle delay locked loop circuit of claim 13, wherein the charge pump is configured to determine a control signal for the N delay elements based on the phase difference from the phase detector.

17. A half cycle delay locked loop, comprising:
means for receiving an oscillator input signal having a clock cycle of M;
means for delaying that output N different phase-shifted signals, wherein a total delay introduced by the means for delaying is M/2;
means for inverting, wherein each means for inverting is coupled to an output of one of the N means for delaying;
means for detecting a phase difference between the oscillator input signal and an Nth inverted phase-shifted signal; and
means for determining a control signal.

18. The half cycle delay locked loop of claim 17, further comprising means for combining one or more of the phase-shifted signals.

19. The half cycle delay locked loop of claim 18, wherein the means for combining comprises multiple exclusive or (XOR) elements, negated AND (NAND) elements and AND elements.

20. The half cycle delay locked loop of claim 18, wherein the means for inverting comprise means for inverting a portion of the N phase-shifted signals, including the Nth phase-shifted signal, to produce inverted phase-shifted signals.

21. The half cycle delay locked loop of claim 17, wherein the means for combining comprises means for combining less than N of the phase-shifted signals and the inverted phase-shifted signals to produce a frequency multiplied signal with a frequency higher than the oscillator.

22. The half cycle delay locked loop of claim 17, further comprising means for buffering an output of the means for delaying.

23. The half cycle delay locked loop of claim 17, wherein the means for determining a control signal comprises means for determining a control signal for the means for delaying based on the phase difference from the means for detecting.

24. A method for frequency multiplication, comprising:
receiving an oscillator signal with a clock period of M;
delaying the oscillator signal with N delay elements to produce N phase-shifted signals, wherein a total delay introduced by the N delay elements is M/2;
inverting less than N phase-shifted signals, including the Nth phase-shifted signal, to produce inverted phase-shifted signals;
detecting a phase difference between the oscillator signal and an Nth inverted phase-shifted signal; and
determining a control signal for the delay elements based on the phase difference.

25. The method of claim 24, further comprising combining less than N of the phase-shifted signals and the inverted phase-shifted signals to produce a frequency multiplied signal with a frequency higher than the oscillator signal.

26. The method of claim 25, wherein the combining comprises using multiple exclusive or (XOR) elements, negated AND (NAND) elements and AND elements.

27. The method of claim 24, further reading out less than N phase-shifted signals using read buffers.

28. The method of claim 24, further comprising adjusting the delay of each delay element based on the control signal.

29. The method of claim 25, wherein the frequency multiplied signal has a frequency that is an integer multiple of the frequency of the oscillator signal.

30. The method of claim 28, further comprising low-pass filtering the control signal before the adjusting.

31. A processor-readable storage medium having one or more instructions operational in an access network device, which when executed by one or more processors causes the one or more processors to:
receive an oscillator signal with a clock period of M;
delay the oscillator signal with N delay elements to produce N phase-shifted signals, wherein a total delay introduced by the N delay elements is M/2;
invert less than N phase-shifted signals, including the Nth phase-shifted signal, to produce inverted phase-shifted signals;
detect a phase difference between the oscillator signal and an Nth inverted phase-shifted signal; and
determine a control signal for the delay elements based on the phase difference.

* * * * *